(12) United States Patent
Lee

(10) Patent No.: US 9,305,985 B2
(45) Date of Patent: Apr. 5, 2016

(54) ORGANIC LIGHT-EMITTING DIODE (OLED) DISPLAY AND METHOD OF MANUFACTURING THE SAME

(71) Applicant: Samsung Display Co., Ltd., Yongin, Gyeonggi-Do (KR)

(72) Inventor: Dae-Won Lee, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 46 days.

(21) Appl. No.: 14/281,597

(22) Filed: May 19, 2014

(65) Prior Publication Data

US 2015/0179721 A1   Jun. 25, 2015

(30) Foreign Application Priority Data

Dec. 20, 2013  (KR) ......................... 10-2013-0160552

(51) Int. Cl.
| | |
|---|---|
| *H01L 27/32* | (2006.01) |
| *H01L 51/56* | (2006.01) |
| *H01L 51/52* | (2006.01) |
| *H01L 51/00* | (2006.01) |

(52) U.S. Cl.
CPC ........ *H01L 27/3258* (2013.01); *H01L 27/3251* (2013.01); *H01L 51/0024* (2013.01); *H01L 51/5246* (2013.01); *H01L 51/56* (2013.01); *H01L 2227/323* (2013.01)

(58) Field of Classification Search
CPC ..... H01L 51/5246; H01L 51/24; H01L 51/56; H01L 27/3258

USPC ................................ 257/40; 438/28; 313/512
See application file for complete search history.

(56) References Cited

U.S. PATENT DOCUMENTS

| | | | |
|---|---|---|---|
| 8,067,883 B2 | 11/2011 | Wang | |
| 2004/0178727 A1 | 9/2004 | Song | |
| 2004/0263740 A1* | 12/2004 | Sakakura et al. | ............. 349/138 |
| 2014/0138668 A1 | 5/2014 | You et al. | |

FOREIGN PATENT DOCUMENTS

| | | |
|---|---|---|
| KR | 1999-0054225 | 7/1999 |
| KR | 10-0522689 B1 | 10/2005 |
| KR | 10-2005-0116278 A | 12/2005 |
| KR | 10-0643891 B1 | 11/2006 |
| KR | 10-2009-0041613 A | 4/2009 |
| KR | 10-2012-0077470 A | 7/2012 |

* cited by examiner

*Primary Examiner* — Cuong Q Nguyen
*Assistant Examiner* — Tong-Ho Kim
(74) *Attorney, Agent, or Firm* — Knobbe, Martens, Olson & Bear, LLP

(57) ABSTRACT

An organic light-emitting diode (OLED) display and method of manufacturing the same are disclosed. In one aspect, the OLED display includes a first substrate including a display area, a display unit formed in the display area and including an insulating layer, and a second substrate formed over the display layer. A sealant material is interposed between the first and second substrates and substantially seals the first and second substrates to each other. At least one hole is formed in a first portion of the insulating layer and at least one recess is formed in a second portion of the insulating layer. The sealant is substantially filled in the hole and the recess.

13 Claims, 5 Drawing Sheets

ORGANIC LIGHT-EMITTING DIODE (OLED) DISPLAY AND METHOD OF MANUFACTURING THE SAME

CROSS-REFERENCE TO RELATED APPLICATIONS

This application claims the benefit of Korean Patent Application No. 10-2013-0160552, filed on Dec. 20, 2013, in the Korean Intellectual Property Office, the disclosure of which is incorporated herein in its entirety by reference.

BACKGROUND

1. Field

The described technology generally relates to an organic light-emitting diode (OLED) display and a method of manufacturing the same.

2. Description of the Related Technology

Flat panel displays such as organic light-emitting diode (OLED) displays include a matrix of pixel with signals driven by a thin film transistor (TFT). These displays can be used as a display device for a mobile device such as a smartphone, a tablet PC, an ultra slim laptop computer, a digital camera, a video camera, or a portable information terminal or other electronic/electric products such as an ultra slim televisions.

OLED displays include an upper substrate and a lower substrate, such as glass or plastic sheets, that are sealed to protect the OLEDs from contaminants. A sealing or filler material is applied between the upper and lower substrates and hardened to bond the two substrates together. The lifespan and reliability of such an OLED display depends upon the bonding strength between the upper and lower substrates.

SUMMARY OF CERTAIN INVENTIVE ASPECTS

One inventive aspect is an OLED display and a method of manufacturing the same.

Another aspect is an OLED display including a first substrate, a display unit defining a display area on the first substrate and including an insulating layer, a second substrate formed on the display unit, and a sealant formed between the first substrate and the second substrate for bonding the first substrate and the second substrate to each other, wherein a hole is formed in the insulating layer and a recess is formed in an inner side wall of the hole into the insulating layer and the sealant is filled in the hole and the recess.

A plurality of the holes may be formed.

The recess may be formed to be substantially parallel to the first substrate.

The display unit may include a thin film transistor (TFT), the TFT may include an active layer, a gate insulating layer formed on the active layer, a gate electrode, a source electrode, and a drain electrode formed on the active layer, and an interlayer dielectric layer formed between the gate electrode and the source electrode and between the gate electrode and the drain electrode, the insulating layer may include the gate insulating layer and the interlayer insulating layer, and the recess may be formed into the interlayer insulating layer.

The OLED display may further include a buffer layer formed directly on the first substrate, wherein the insulating layer may further include the buffer layer.

Another aspect is a method of manufacturing an OLED display the method including forming a gate insulating layer on a surface of a first substrate, patterning a metal layer on the gate insulating layer, forming an interlayer insulating layer on the metal layer, etching a first region of the metal layer, removing a remaining portion of the metal layer, and applying a sealant into the first region and a space where the metal layer is removed.

The first region may be etched in a dry-etching method.

The metal layer may be formed of a material that can be wet-etched and the remaining portion of the metal layer may be removed by a wet-etching method.

The method may further include forming a buffer layer directly on the first substrate.

The first region may be a center region of the metal layer.

DETAILED DESCRIPTION OF CERTAIN INVENTIVE EMBODIMENTS

Figure 1:
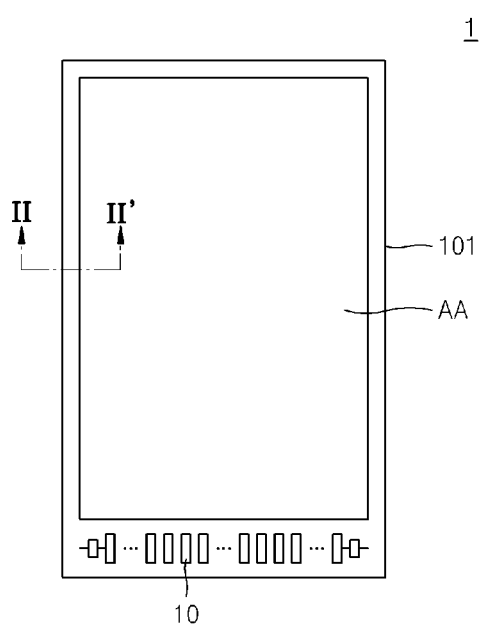
FIG. 1 is a schematic plan view of an OLED display according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the described technology.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may also be present.

Sizes of elements in the drawings may be exaggerated for convenience of explanation. In other words, since the sizes and thicknesses of components in the drawings may be exaggerated for convenience of explanation, the following embodiments are not limited thereto. The term "substantially" as used in this disclosure means completely, almost completely, or to any significant degree.

Hereinafter, embodiments of the described technology will be described in detail with reference to accompanying drawings.

Figure 2:
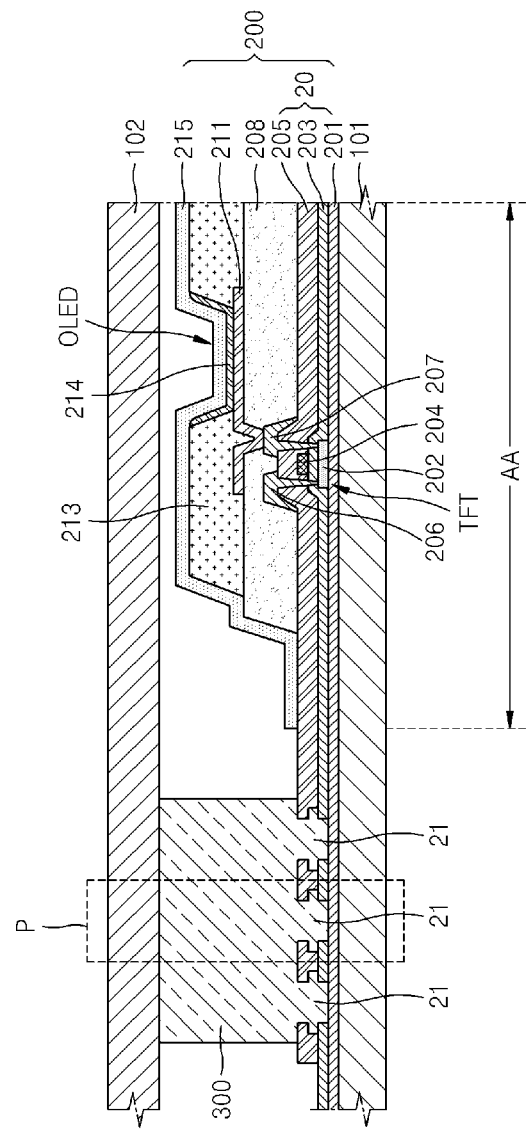
FIG. 2 is a cross-sectional view of the OLED display taken along line II-II' of FIG. 1.
Figure 3:
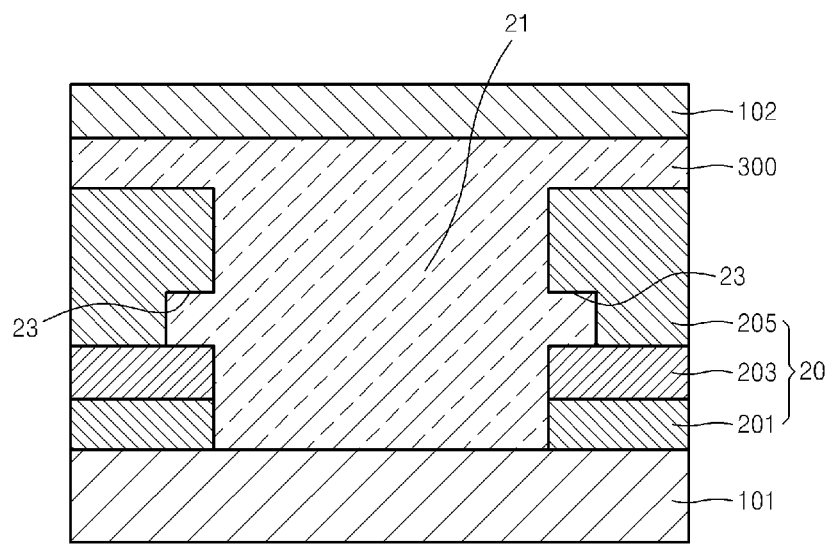
FIG. 3 is an enlarged view of a portion P of FIG. 2.

Referring to FIGS. 1 through 3, an organic light-emitting diode (OLED) display 1 according to an embodiment includes a first substrate 101, a display unit or display layer 200 defining a display area AA on the first substrate 101, a second substrate 102 formed on the display unit 200, and a sealant 300 for bonding the first and second substrates 101 and 102 to each other.

The first substrate 101 can be flexible and can be formed of a plastic material having a high heat resistance and high durability. However, the described technology is not limited thereto, that is, the first substrate 101 may be formed of various materials, for example, metal, glass, or the like.

The display unit 200 defines the display area (active area) AA on the first substrate 101 and includes a thin film transistor (TFT) and an OLED that are electrically connected to each other. In addition, a pad portion 10 is formed on at least one side of the display area AA to transfer electric signals from a power supply device (not shown) or a signal generation device (not shown) to the display area AA.

Hereinafter, the display unit 200 will be described in detail below with reference to FIG. 2.

An insulating layer 20 is formed on the first substrate 101. In the FIG. 2 embodiments, the insulating layer 20 includes a buffer layer 201, a gate insulating layer 203, and an interlayer insulating layer 205.

The buffer layer 201 is formed on the first substrate 101. The buffer layer 201 is formed on substantially the entire surface of the first substrate 101, that is, on the display area AA and a peripheral portion of the display area AA. The buffer layer 201 prevents impurities from penetrating through the first substrate 101 and provides a flat surface on the first substrate 101. The buffer layer 201 may be formed of various materials capable of performing the above functionalities.

For example, the buffer layer 201 may include an inorganic material such as silicon oxide, silicon nitride, silicon oxynitride, aluminum oxide, titanium oxide, or titanium nitride, or an organic material such as polyimide, polyester, or acryl, and may be formed to have a stacked structure including a plurality of layers of the above materials.

The TFT is formed on the buffer layer 201. The TFT includes an active layer 202, a gate electrode 204, a source electrode 206, and a drain electrode 207.

The active layer 202 may be formed of inorganic semiconductor such as amorphous silicon or polysilicon, or oxide semiconductor, and includes a source region, a drain region, and a channel region.

The gate insulating layer 203 is formed on the active layer 202. The gate insulating layer 203 is formed over substantially the entire first substrate 101. That is, the gate insulating layer 203 is formed over the display area AA and the peripheral portion of the display area AA on the first substrate 101. The gate insulating layer 203 insulates the active layer 202 from the gate electrode 204 and may be formed of an organic material or inorganic material such as $SiN_x$ or $SiO_2$.

The gate electrode 204 is formed on the gate insulating layer 203. The gate electrode 204 can be formed of one or more of Au, Ag, Cu, Ni, Pt, Pd, Al, Mo, or an alloy such as Al:Nd or Mo:W; however, the described technology is not limited thereto. The gate electrode 204 may be formed of various materials in consideration of the design conditions.

The interlayer insulating layer 205 is formed on the gate electrode 204. The interlayer insulating layer 204 is formed over substantially the entire first substrate 101. That is, the interlayer insulating layer 205 is formed over to the display area AA and the peripheral portion of the display area AA.

The interlayer insulating layer 205 is interposed between the gate electrode 204 and the source electrode 206 and between the gate electrode 204 and the drain electrode 207 to electrically insulate them from each other. The interlayer insulating layer 205 may be formed of an inorganic material such as $SiN_x$ or $SiO_2$.

A plurality of holes 21 are formed in the insulating layer 20. The holes 21 are formed on an outer portion of the display area AA. Each of the holes 21 may be formed to have a rectangular cross-section. The holes 21 are formed in the insulating layer 20 and the sealant 300 is applied on the insulating layer 20 filling the holes 21, and thus, the contact area between the sealant 300 and the insulating layer 20 increases. Accordingly, the bonding strength between the first substrate 101 and the second substrate 102 is improved.

The source electrode 206 and the drain electrode 207 are formed on the interlayer insulating layer 205. In particular, the interlayer insulating layer 205 and the gate insulating layer 203 are formed to expose the source region and the drain region in the active layer 202 and the source and drain electrodes 206 and 207 are respectively formed to contact the exposed source region and the exposed drain region in the active layer 202. When forming the interlayer insulating layer 205 and the gate insulating layer 203 to expose the source and drain regions in the active layer 202, an irregular portion 209 may be formed without performing an additional manufacturing process.

Furthermore, the embodiment of FIG. 2 illustrates a top gate type TFT including the active layer 202, the gate electrode 204, and the source and drain electrodes 206 and 207; however, the described technology is not limited thereto. According to other embodiments, the gate electrode 204 is formed under the active layer 202.

The TFT is electrically connected to the OLED so as to drive the OLED and is covered and protected by a passivation layer 208.

The passivation layer 208 may be an inorganic insulating layer and/or an organic insulating layer.

The OLED is formed on the passivation layer 208 and the OLED includes a pixel electrode 211, an intermediate layer 214, and an opposite electrode 215.

The pixel electrode 211 is formed on the passivation layer 208. In more detail, the passivation layer 208 does not cover the entire drain electrode 207, but exposes a portion of the drain electrode 207 and the pixel electrode 211 is formed to be connected to the exposed portion of the drain electrode 207.

According to some embodiments, the pixel electrode 211 is a reflective electrode.

The opposite electrode 215 formed to face the pixel electrode 211 may be a transparent electrode or a semi-transparent electrode.

Accordingly, the opposite electrode 215 transmits light emitted from an organic emission layer included in the intermediate layer 214. That is, the light emitted from the organic emission layer is transmitted through the opposite electrode 215 directly or after being reflected by the reflective pixel electrode 211.

However, the OLED display 1 is not limited to a top emission type display. According to other embodiments, the OLED display 1 is a bottom emission display in which the light emitted from the organic emission layer is transmitted through the first substrate 101. In these embodiments, the pixel electrode 211 is a transparent electrode or a semi-transparent electrode and the opposite electrode 215 is a reflective electrode. Also, the OLED display 1 can be a dual emission type that emits light in the opposing directions, that is, through the top and bottom surfaces.

Meanwhile, a pixel defining layer 213 is formed of an insulating material on the pixel electrode 211. The pixel defining layer 213 exposes a predetermined region of the pixel electrode 211 and the intermediate layer 214 is located in the exposed region.

The intermediate layer 214 includes the organic emission layer. In another example, the intermediate layer 214 includes an organic emission layer and may further include at least one of a hole injection layer (HIL), a hole transport layer (HTL), an electron transport layer (ETL), and an electron injection layer (EIL). However, the described technology is not limited thereto. In some embodiments, the intermediate layer 214 includes an organic emission layer and further includes other various functional layers.

The second substrate 102 is formed over the opposite electrode 215. The second substrate 102 may be a flexible substrate and may be formed of a plastic material having a high heat resistance and high durability. However, the described technology is not limited thereto, and in other embodiments, the second substrate 102 is formed of various materials such as metal, glass, or the like.

The sealant 300 is interposed between the first substrate 101 and the second substrate 102. The sealant 300 bonds the first substrate 101 to the second substrate 102. The sealant 300 is formed on the outer portion of the display area AA, i.e., in a peripheral area surrounding the display are AA. The sealant 300 may include a fit. The sealant 300 is a blocking layer for blocking impurities such as oxygen and moisture from penetrating, thereby protecting the organic materials in the display unit 200. against external oxygen and impurities such as moisture.

The sealant 300 is formed on the insulating layer 20. The sealant 300 fills the holes 21 formed in the insulating layer 20. Accordingly, the bonding force between the first substrate 101 and the second substrate 102 can be improved.

Hereinafter, the insulating layer 20 will be described in more detail with reference to FIG. 3.

The insulating layer 20 includes the buffer layer 201, the gate insulating layer 203, and the interlayer insulating layer 205.

The hole 21 is formed in the insulating layer 20, and in some embodiments, the hole 21 has a substantially rectangular cross-section. When the sealant 300 is filled in the hole 21 in the insulating layer 20, the bonding strength between the first substrate 101 and the second substrate 102 is improved.

A recess 23 is formed in an inner side wall of the hole 21. In the embodiment of FIG. 3, the recess 23 is formed in the interlayer insulating layer 205. The recess 23 is located on the gate insulating layer 203. The recess 23 is formed to be substantially parallel to the first substrate 101. The sealant 300 is filled in the recess 23, and accordingly, the sealant 300 filled in the hole 21 is placed on the insulating layer 20. Since the sealant 300 is placed on the insulating layer 20, the first substrate 101, the insulating layer 20 and second substrate 102 are firmly bonded to each other.

FIGS. 4A through 4D are schematic cross-sectional views illustrating a method of manufacturing an OLED display according to an embodiment.

Referring to FIGS. 4A through 4D, the method of manufacturing the OLED display includes forming a gate insulating layer on a surface of a first substrate, patterning a metal layer on the gate insulating layer, forming an interlayer insulating layer on the metal layer, etching a first region of the metal layer, removing the remaining metal layer, and applying a sealant into the first region and a space where the metal layer is removed.

Figure 4A:
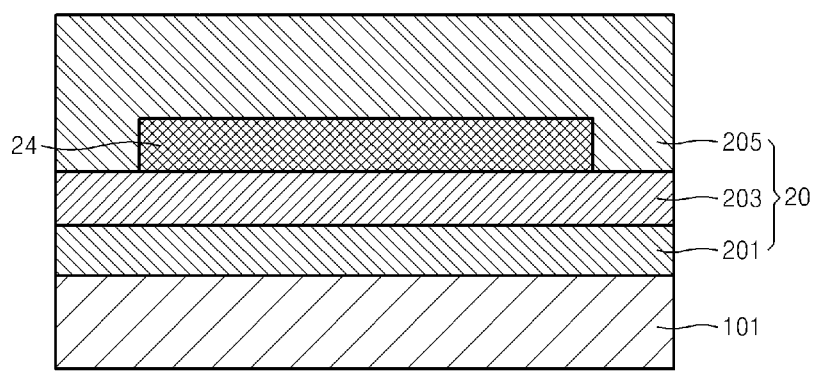
FIGS. 4A through 4D are schematic cross-sectional views illustrating a method of manufacturing an OLED display according to an embodiment.

As shown in FIG. 4A, the insulating layer 20 and a metal layer 24 are formed on a surface of the first substrate 101. The buffer layer 201 and the gate insulating layer 203 are formed on the surface of the first substrate 101. The metal layer 24 is patterned on the gate insulating layer 203. The metal layer 24 is formed of a material that can be wet-etched. The metal layer 24 can be formed of the same material as the gate electrode 204. The metal layer 204 can be formed in the same process of forming the gate electrode 204. That is, the interlayer insulating layer 205 is formed covering the metal layer 24 and the gate insulating layer 203.

Figure 4B:
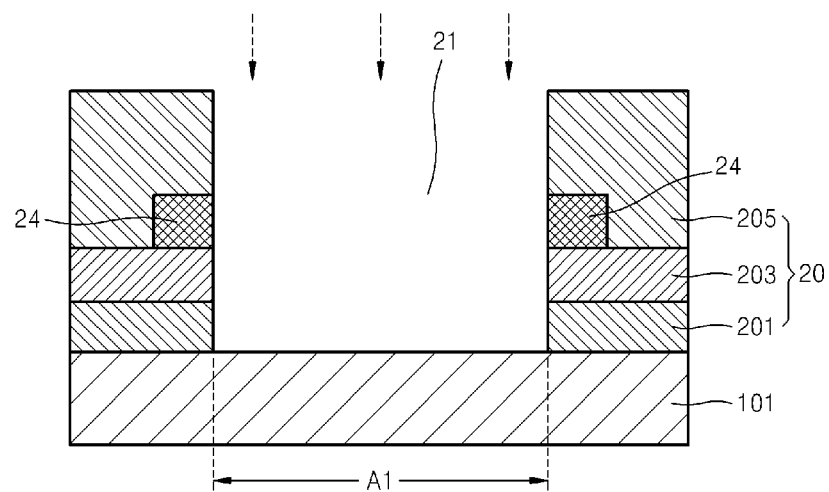

Next, as shown in FIG. 4B, a first region A1 of the metal layer 24 is etched. The first region A1 is a center area of the metal layer 24. The first region A1 of the metal layer 24 can be etched in a dry-etching method. When the first region A1 of the metal layer 24 is etched, the hole 21 is formed in the insulating layer 20. Portions of the metal layer 24 excluding the first region A1 remain after the etching.

Figure 4C:
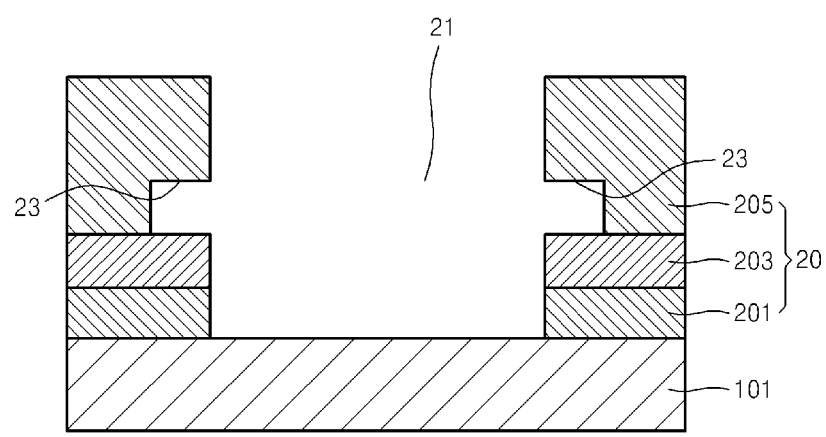

Next, as shown in FIG. 4C, the remaining portions of the metal layer 24 are removed. The remaining portions of the metal layer 24 can be removed by a wet-etching process. After the metal layer 24 is removed, the recess 23 is formed in the inner side wall of the hole 21 in the insulating layer 20. The recess 23 is formed in the interlayer insulating layer 205. The recess 23 is also formed on the gate insulating layer 203 and is substantially parallel to the first substrate 101.

Figure 4D:
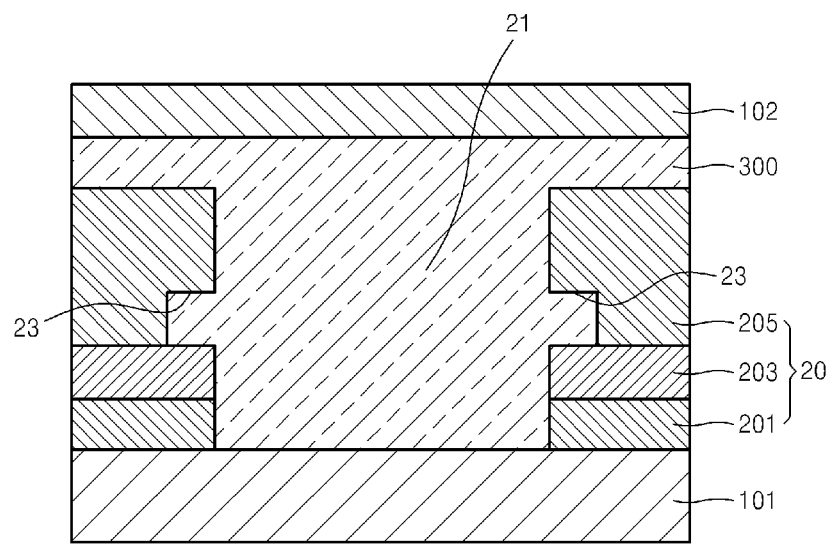

Next, as shown in FIG. 4D, the second substrate 102 is formed over the insulating layer 20 and the sealant 300 is applied to the insulating layer 20 in order to fill the hole 21 and the recess 23 formed in the insulating layer 20. Thus, a portion of the sealant 300 fills the hole 21 forming a filled hole 22 containing a portion of the sealant 300. Accordingly, the OLED display 1 is manufactured.

As described above, according to at least one embodiment, the bonding strength between the upper and lower substrates is improved, thereby improving the lifespan and reliability of the OLED display.

It should be understood that the exemplary embodiments described herein should be considered in a descriptive sense only and not for purposes of limitation. Descriptions of features or aspects within each embodiment should typically be considered as available for other similar features or aspects in other embodiments.

While one or more embodiments of the invention have been described with reference to the figures, it will be understood by those of ordinary skill in the art that various changes in form and details may be made therein without departing from the spirit and scope of the invention as defined by the following claims.

What is claimed is:

1. An organic light-emitting diode (OLED) display, comprising:
   a first substrate including a display area;
   a display unit formed in the display area and including an insulating layer;
   a second substrate formed over the display unit; and
   a sealant material interposed between the first and second substrates and substantially sealing the first and second substrates to each other,
   wherein at least one hole is formed in a first portion of the insulating layer,
   wherein at least one recess is formed in a second portion of the insulating layer,
   wherein the sealant substantially fills the hole and the recess, and
   wherein the vertical height of the recess is less than the vertical height of the hole.

2. The OLED display of claim 1, wherein the at least one hole comprises a plurality of holes, wherein the at least one recess comprises a plurality of recesses respectively corresponding to and adjacent to the holes, and wherein the sealant is substantially filled in each of the holes and the recesses.

3. The OLED display of claim 1, wherein the recess is substantially parallel to the first substrate.

4. The OLED display of claim 1, wherein the display unit comprises:
   a thin film transistor (TFT) including i) an active layer, ii) a gate insulating layer formed over the active layer, and iii) a gate electrode, a source electrode, and a drain electrode formed over the active layer; and
   an interlayer insulating layer interposed i) between the gate electrode and the source electrode and ii) between the gate electrode and the drain electrode,
   wherein the insulating layer comprises the gate insulating layer and the interlayer insulating layer, and
   wherein the recess is formed in the interlayer insulating layer.

5. The OLED display of claim 4, further comprising a buffer layer formed directly on the first substrate, wherein the insulating layer further comprises the buffer layer.

6. The OLED display of claim 1, wherein the hole is connected to the recess.

7. The OLED display of claim 1, wherein the hole is significantly greater in dimension than the recess.

8. An organic light-emitting diode (OLED) display, comprising:
   a substrate including a display area and a peripheral area surrounding the display area;
   a plurality of pixels formed in the display area, wherein each pixel comprises an OLED;
   an insulating layer formed in the display area and the peripheral area; and
   a sealing thin film formed over the insulating layer,
   wherein at least one hole is defined in a first portion of the insulating layer in the peripheral area,
   wherein at least one recess is defined in a second portion of the interlayer insulating layer in the peripheral area,
   wherein the sealing thin film is formed in the hole and the recess, and
   wherein the vertical height of the recess is less than the vertical height of the hole.

9. The OLED display of claim 8, wherein the insulating layer comprises:
   a buffer layer formed over the substrate;
   a gate insulating layer formed over the buffer layer; and
   an interlayer insulating layer formed over the gate insulating layer.

10. The OLED display of claim 9, wherein the recess is formed only in the interlayer insulating layer and wherein the vertical height of the recess is less than the vertical height of the interlayer insulating layer.

11. The OLED display of claim 8, wherein the recess is substantially parallel to the substrate.

12. The OLED display of claim 8, wherein the at least one hole comprises a plurality of holes, wherein the at least one recess comprises a plurality of recesses corresponding to the holes, and wherein the sealing thin film formed in each of the holes and the recesses.

13. The OLED display of claim 8, wherein the holes are arranged in a direction from the display area to an edge of the substrate.

* * * * *